(12) United States Patent
Doerr

(10) Patent No.: US 11,448,823 B1
(45) Date of Patent: Sep. 20, 2022

(54) METHOD, SYSTEM, AND APPARATUS FOR A LIDAR SENSOR WITH A LARGE GRATING

(71) Applicant: Acacia Communications, Inc., Maynard, MA (US)

(72) Inventor: Christopher Doerr, Middletown, NJ (US)

(73) Assignee: Acacia Communications, Inc., Maynard, MA (US)

( * ) Notice: Subject to any disclaimer, the term of this patent is extended or adjusted under 35 U.S.C. 154(b) by 0 days.

(21) Appl. No.: 16/104,866

(22) Filed: Aug. 17, 2018

Related U.S. Application Data

(60) Provisional application No. 62/547,714, filed on Aug. 18, 2017.

(51) Int. Cl.
  *G02B 6/12* (2006.01)
  *G02B 6/122* (2006.01)
  *H01S 5/14* (2006.01)
  *G02B 26/10* (2006.01)

(52) U.S. Cl.
  CPC ......... *G02B 6/122* (2013.01); *G02B 6/12016* (2013.01); *G02B 26/10* (2013.01); *H01S 5/141* (2013.01)

(58) Field of Classification Search
  CPC ..... G02B 6/0944; G02B 6/30; G02B 27/0087
  See application file for complete search history.

(56) References Cited

U.S. PATENT DOCUMENTS

| | | | | |
|---|---|---|---|---|
| 5,228,103 A | * | 7/1993 | Chen | G01J 3/0259 359/333 |
| 6,434,303 B1 | * | 8/2002 | Temkin | G02B 6/12011 385/43 |
| 6,532,090 B1 | * | 3/2003 | Doerr | H04Q 11/0005 385/17 |
| 6,754,410 B1 | * | 6/2004 | Doerr | G02B 6/12011 385/129 |
| 7,265,713 B2 | * | 9/2007 | Lewis | H01Q 21/0087 342/372 |
| 7,868,828 B2 | * | 1/2011 | Shi | H01Q 1/32 343/700 MS |
| 8,467,641 B2 | * | 6/2013 | Krill | G02B 6/12004 385/17 |
| 8,699,837 B2 | * | 4/2014 | Baets | G02B 6/125 385/37 |
| 8,988,754 B2 | * | 3/2015 | Sun | G02F 1/0147 359/238 |
| 9,128,241 B2 | * | 9/2015 | Baets | G02B 6/124 |
| 9,766,398 B2 | * | 9/2017 | Kong | G02B 6/124 |
| 9,851,443 B2 | * | 12/2017 | Chen | G01S 17/42 |
| 10,365,434 B2 | * | 7/2019 | Wang | G01N 21/774 |
| 10,649,306 B2 | * | 5/2020 | Skirlo | G01S 7/4814 |
| 2003/0081888 A1 | * | 5/2003 | Doerr | G02B 6/12004 385/24 |

(Continued)

OTHER PUBLICATIONS

Doerr et al., Circular grating coupler for creating focused azmiuthaly and radially polarized beams., Optics Letters, V. 36, N. 7 (Year: 2011).*

(Continued)

*Primary Examiner* — Peter Radkowski
(74) *Attorney, Agent, or Firm* — Joseph D'Angelo

(57) ABSTRACT

A method and apparatus for scanning a scene.

17 Claims, 13 Drawing Sheets

FRONT VIEW

(56) References Cited

U.S. PATENT DOCUMENTS

| | | | |
|---|---|---|---|
| 2006/0227049 A1* | 10/2006 | Lewis | H01Q 21/0087 342/372 |
| 2009/0231580 A1* | 9/2009 | Nagy | G02B 6/29311 356/326 |
| 2011/0222814 A1* | 9/2011 | Krill | G02B 6/12004 385/3 |
| 2012/0002971 A1* | 1/2012 | Doerr | G02B 6/124 398/115 |
| 2013/0242400 A1* | 9/2013 | Chen | G01S 17/42 359/618 |
| 2014/0010498 A1* | 1/2014 | Versiegers | G02B 5/1861 385/37 |
| 2014/0192394 A1* | 7/2014 | Sun | G02B 6/12033 359/289 |
| 2014/0363127 A1* | 12/2014 | Baets | G02B 6/124 385/37 |
| 2015/0346340 A1* | 12/2015 | Yaacobi | G01S 17/931 356/5.11 |
| 2016/0049765 A1 | 2/2016 | Eldada | |
| 2016/0363728 A1* | 12/2016 | Wang | G02B 6/34 |
| 2017/0082800 A1* | 3/2017 | Kong | G02B 6/124 |
| 2019/0265574 A1* | 8/2019 | Skirlo | G01S 7/4817 |

OTHER PUBLICATIONS

Bock et al., Demonstration of a curved sidewall grating demultiplexer on silicon, Optics Express, V. 20, N. 18. (Year: 2012).*

Halier et al., Waveguide sub-wavelength structures: a review of principles and applications, Laser Photonics Rev. 9, No. 1, 25-49 (2015) (Year: 2015).*

L.D. Landau, E.M. Lifshitz, in The Classical Theory of Fields (Fourth Edition), 1975, https://www.sciencedirect.com/topics/mathematics/center-of-curvature (Year: 1975).*

Slivken et al., Monolithic beam steering in a mid-infrared, surface-emitting, photonic integrated circuit, Scientific Reports, Published online Aug. 16, 2017; 7: 8472 | DOI:10.1038/s41598-017-08916-9 (Year: 2017).*

Agrawal, Vishwani D., Grating-Lobe Suppression in Phased Arrays by Subarray Rotation, Proceedings Letters, Proceedings of the IEEE, V. 66, N. 3, Mar. 1978 (Year: 1978).*

V. E. Leshchenko, "Coherent combining efficiency in tiled and filled aperture approaches," Opt. Express 23, 15944-15970 (2015) (Year: 2015).*

J. Yu, V. A. Khlebnikov and M. Ka, "Wideband Grating-Lobe Suppression by Rotation of the Phased Array Stations in the SKA Low-Frequency Sparse Aperture Array," in IEEE Transactions on Antennas and Propagation, vol. 63, No. 9, pp. 3939-3946, Sep. 2015, doi: 10.1109/TAP.2015.2452965. (Year: 2015).*

Kim et al., Characterization of a Focusing Waveguide Grating Coupler Using a loch-Wave Analysis-Based Local Linear Grating Model and Near-Field Scanning Optical Microscope, Journal of the Korean Physical Society, vol. 46, No. 4, Apr. 2005, p. 1013_1019 (Year: 2005).*

R. Stabile, A. Rohit and K. A. Williams, "Monolithically Integrated 8×8 Space and Wavelength Selective Cross-Connect," in Journal of Lightwave Technology, vol. 32, No. 2, pp. 201-207, Jan. 15, 2014, doi: 10.1109/JLT.2013.2290322. (Year: 2014).*

Doerr, et al., "O , E, S, C, and L Band Silicon Photonics Coherent Modulator/Receiver," in OFC, 2016, pp. 8-10.

Doylend, et al., "Hybrid III/V Silicon Photonic Source with Integrate 1D free-space Beam Steering," Opt. Lett. vol. 37, No. 20, 2012, pp. 4257-4259.

Poulton, et al., "Frequency-modulated Continuous-wave LIDAR Module in Silicon Photonics," in OFC, No. c, 2016, pp. 4-6.

Sun, et al., "Large-Scale Integrated Silicon Photonic Circuits for Optical Phased Arrays," in Adv. Photonics Commun., vol. 1, No. c, 2014, pp. 9-11.

* cited by examiner

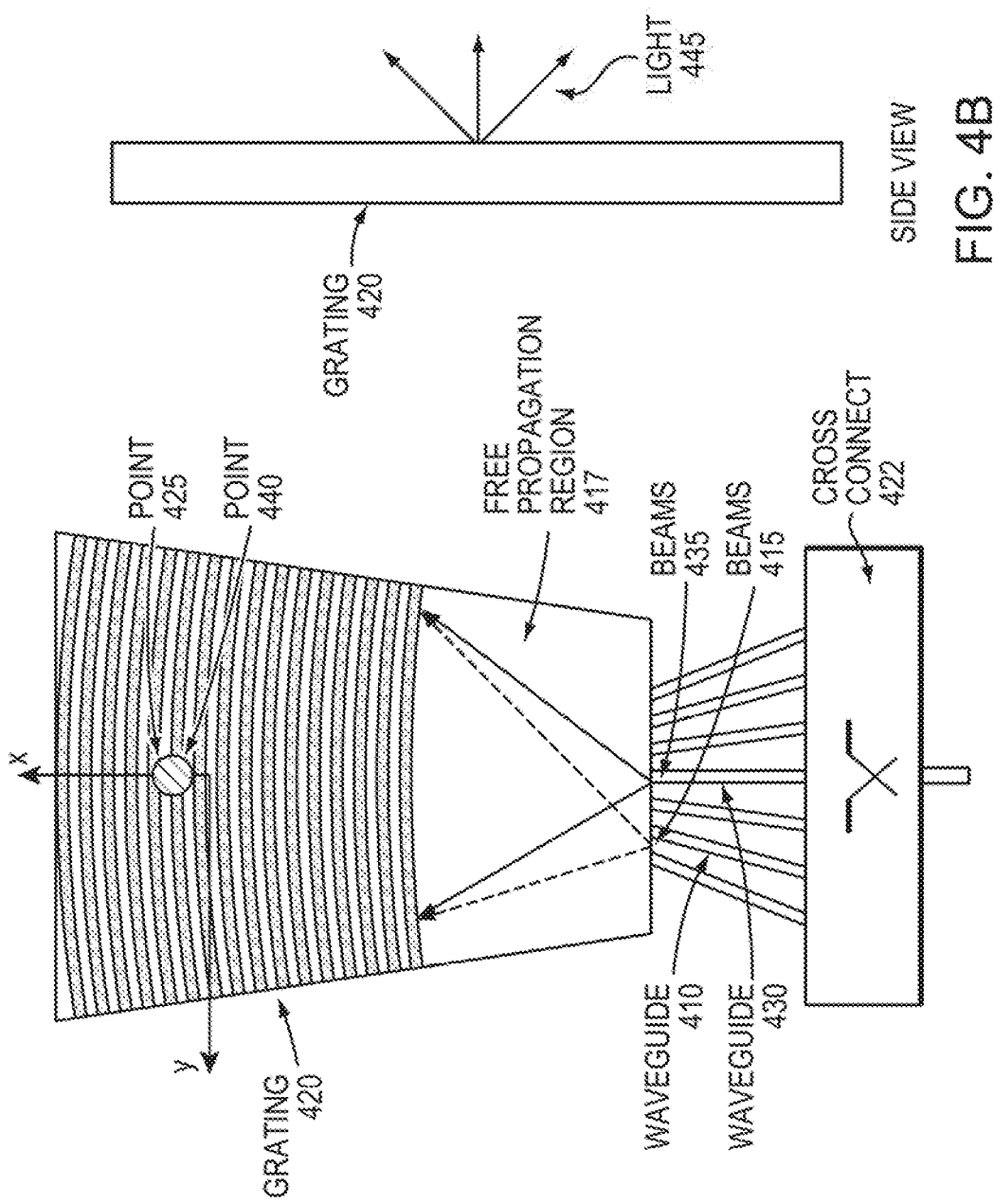
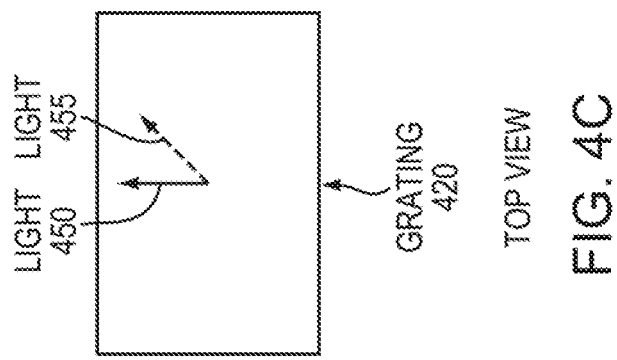
FIG. 4A FRONT VIEW
FIG. 4B SIDE VIEW
FIG. 4C TOP VIEW

METHOD, SYSTEM, AND APPARATUS FOR A LIDAR SENSOR WITH A LARGE GRATING

RELATED APPLICATIONS

The present application claims the benefit under 35 U.S.C. § 119(e) of U.S. Patent Application Ser. No. 62/547,714 filed Aug. 18, 2017 and entitled "STEERING A BEAM WITH A GRATING," which is hereby incorporated herein by reference in its entirety. This present application is also related to U.S. patent application Ser. No. 16/104869 filed on instant date herewith under and entitled "METHOD, APPARATUS, AND SYSTEM FOR LIDAR SENSOR WITH VARYING GRATING PITCH," and patent application Ser. No. 16/104872 filed on instant date herewith under and entitled "METHOD, APPARATUS, AND SYSTEM FOR LIDAR SENSOR WITH ORTHOGONAL ARRAYS, which are both hereby incorporated herein by reference in their entirety.

BACKGROUND

Scanning systems often transmit a signal and measure a reflection of the signal at a receiver.

BRIEF DESCRIPTION OF THE FIGURES

Various aspects and embodiments of the application will be described with reference to the following example embodiments. It should be appreciated that the figures are not necessarily drawn to scale.

FIGS. 4a, 4b, and 4c are simplified illustrations of a front, side and top view of a surface-emitting grating, in accordance with an embodiment of the present disclosure;

SUMMARY

Figure 1:
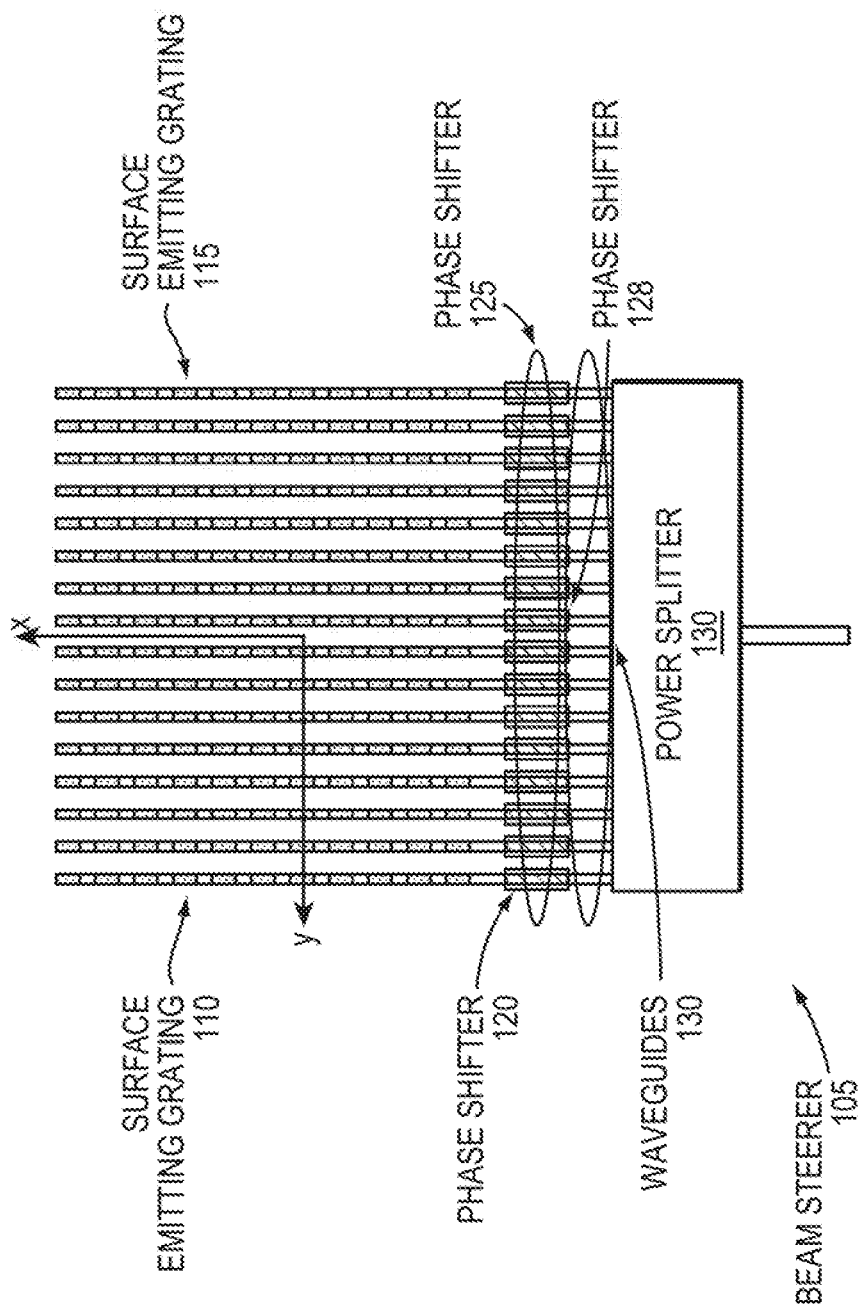
FIG. 1 is a simplified illustration of an array of 1D surface-emitting gratings, in accordance with an embodiment of the present disclosure.

A method and apparatus for scanning a scene.

DETAILED DESCRIPTION

Conventionally, a beam steerer may be used for light detection and ranging (LiDAR) and optical coherence tomography (OCT). Typically, a non-mechanical beam steerer is traditionally made using a phased array. Usually, a phased array is a 1D or 2D array of emitters which are phase controlled to steer the emitted beam. Conventionally there are phase shifters on each grating input. For 1-D arrays, traditionally phase shifters control how the beam steers in the y dimension, and wavelength is adjusted to steer in the x dimension. Usually, to steer over a large angular range in the y dimension, the waveguides must be spaced less than a wavelength apart. Conventionally, here are non-uniform spacing designs to steer with a larger spacing while mitigating energy in higher orders, but these have significant drawbacks.

In most embodiments, the current disclosure has realized that a close spacing of waveguides may result in crosstalk between waveguides and difficulties in fabrication. In certain embodiments, the current disclosure has realized that phases are partially randomized after fabrication, so a lengthy, complicated calibration of phase shifters for a conventional beam steerer may be required. In many embodiments, the current disclosure has realized that controlling many phase shifters may require significant power consumption and may make it difficult to avoid thermal crosstalk. In certain embodiments, the current disclosure has realized that gaps between waveguides may reduce the overall grating efficiency.

In certain embodiments herein, an optical cross-connect (OXC) may be a device used to optically connect one or more of a set of input optical ports to one or more of a set of output optical ports. In some embodiments herein, a grating may be an optical component which diffracts light from multiple elements, creating an interference pattern. In many embodiments herein, a grating emission may refer to a light emission from a grating. In some embodiments, a surface emitting grating may be a grating in a waveguide in a photonics integrated circuit that diffracts light out of the plane of the circuit. In some embodiments, a phase shifter may refer to a device used to change the phase of a beam of light. In many embodiments, cross talk may refer to an undesired influence of a parameter on the outcome. In many embodiments, a waveguide may refer to a guide used to convey or direct a beam of light. In certain embodiments, tuning wavelength may refer to changing the wavelength. In certain embodiments herein, when referring to a beam steerer in the instant disclosure, the beam steerer may be either an emitter or a receiver. In some embodiments herein, a light beam may exit a device at a steerable angle or a light beam may be coupled into the device from a steerable angle. In certain embodiments herein, a optical cross connect and tree of switches may be referred to interchangeably.

In some embodiments, the current disclosure may enable a new type of beam steerer. In certain embodiments, a beam steerer may include a surface-emitting grating illuminated at different angles. In many embodiments, one or more of the techniques of the current disclosure may enable beam steering without a phased array. In certain embodiments, a large surface-emitting grating illuminated by waveguides at different angles may be used to project light on a scene. In most embodiment, steering of a beam used to scan a scene may be steered in the y dimension by illuminating different waveguides at different angles to a grating. In certain embodiments, an optical cross connect may determine which waveguide is illuminated. In most embodiments, to scan in a y dimension, a cross connect may cycle through waveguides.

In many embodiments, beam steering in an x direction may be performed by tuning wavelength. In some embodiments, strength of a surface-emitting grating may be designed to get stronger as x gets larger so as to approximate a Gaussian emission shape from the grating. In some embodiments, increasing a grating groove depth as x gets larger or varying the grating duty cycle may be used to tune the wavelength.

In some embodiments, a grating may be curved, centered approximately on the input waveguides. In certain embodiments, a curvature of a grating may 1 create distortion at large steering angles. In many embodiments, to minimize distortion that may be created by a curvature of a grating, a radius of the curvature may be made as large as possible.

In alternative embodiments, a grating may be straight, and a planar lens structure may be adjacent to the grating.

In many embodiments, silicon photonics may be a suitable platform to fabricate a beam steerer because of the high index contrast and high fabrication quality.

In certain embodiments, equations relating the output angles $\varphi$ and $\theta$ to the input angle $\alpha$ and the wavelength $\lambda$ may be given in Equations 1 and 2

$$\beta \cos \alpha - k \sin \theta \cos \varphi = 2\pi/\Lambda \qquad \text{Equation 1:}$$

$$\beta \sin \alpha + k \sin \theta \sin \varphi = 0 \qquad \text{Equation 2:}$$

Where $\beta$ is the propagation constant in the grating, k is the propagation constant in the free space outside the grating, and $\Lambda$ is the grating pitch. $\beta = 2\pi n_{wg}/\lambda$, and $k = 2\pi n_{fs}/\lambda$, where $n_{wg}$ is the effective index in the grating waveguide, $n_{fs}$ is the index in the free space outside the grating, and $\lambda$ is the wavelength. Angles $\alpha$, $\phi$, and $\theta$ are as shown in the example embodiment of FIG. 3.

In some embodiments of the current disclosure, scanning, with a grating that is tilted downward, may be a beneficial pattern for automotive LiDAR. In certain embodiments, a grating emission may be intentionally biased upward because that makes the scan occur in a single plane for a given wave-length. In most embodiments, a scan may occur in a single plane for a given wave length because for large $\alpha$ there may be cross coupling between the x and y dimensions in the scanning, and this cross coupling may be canceled to first order by tilting the grating off the x- and y-axes. In some embodiments, in order to scan straight ahead, such as on a car, a grating may be angled downward (or equivalently upward if the device is rotated by 180°) by a small angle, such as 20°. In certain embodiments, the grating pitch is adjusted so that the emitted beam is substantially parallel to the ground. In some embodiments, a scan may be tilted up at an angle, such as 20 degrees, relative to a scanning device. In certain embodiments, a beam steerer may be tilted to change the angle of the grating pitch.

In some embodiments, a cross-connect may be a M×N cross connect, where M is the number of lasers and/or receivers to be connected to the grating, and N is the number of scan angles in the y direction. In many embodiments, multiple inputs may be connected to multiple sources so that the inputs may use the grating simultaneously. In certain embodiments, each source may tune over part of a wavelength range, scanning different horizontal bands simultaneously.

In other embodiments, a relatively small N may be used (number of waveguides at different angles $\alpha$). In certain embodiments, a relatively small number of N may reduce the complexity of the optical cross connect. In some embodiments, N waveguides may have a relatively large relative angular spacing between them, which may provide coarse steering over a large range in the y direction. In many embodiments, to provide fine steering a different mechanism may be used. In some embodiments, a fine steering mechanism may be mechanical—such as where a PIC may be rotated a small angle mechanically substantially about the x axis to do the fine steering. In other embodiments, a fine steering mechanism may be electro- or thermo-optical—there may be one or more triangular regions with an adjustable refractive index in the free-space region between the grating and the input waveguides, which may used to change the beam angle a small amount to do the fine steering.

In some embodiments, a mechanical way to do fine steering may be to use piezoelectric (PZT) crystals. In certain embodiments, there may be two or more PZT elements under a PIC used for illumination. In most embodiments, applying a voltage to PZT elements may cause the crystal to expand or contract. In some embodiments, by mounting four PZT elements under corners of a PIC and driving elements paired on each vertical side to the other vertical side in a push pull configuration, the PIC may tilt substantially about the x axis causing fine steering of the beam about the x axis. In most embodiments, tilting around an x axis may allow waveguides connected to a free-space region to have a wide spacing and lower quantity. In many embodiments, tilting around an x axis may simplify a cross connect and PIC design. In most embodiments, the current disclosure has realized that designs may not take advantage of a tilting concept as a typical design may not be able to reduce its number of phase shifters even if there is a fine steering mechanism available. In certain embodiments, tilting a beam steerer around an x axis may enable fine steering, which may in turn reduce the number of waveguides necessary to get a higher resolution image.

In most embodiments, a cross connect may not require calibration because optically interfering arms may be in small Mach-Zehnder interferometers. In most embodiments, a Mach-Zehnder interferometer may comprise two optical couplers connected by two substantially equal-length waveguides. In many embodiments, light entering one port of a first coupler of a Mach-Zehnder may exit one or more of ports of a second coupler of the Mach-Zehnder, the ports and distribution may be determined by the effective length difference between the connecting waveguides. Typically, conventional solutions may have required a large structure containing hundreds of simultaneously interfering arms.

Techniques of the current invention improve on conventional solutions. In certain embodiments, there may be no issues of unwanted coupling between grating waveguides as there may be a large, continuous grating. In many embodiments, the efficiency enabled by the current disclosure may be higher or better than conventional techniques as there may be no gaps in the "phased array." In most embodiments of the current disclosure, no phase-shifter calibration may be required. In certain embodiments of the current disclosure, there may be no phase-shifter thermal/electrical crosstalk issue.

In many embodiments, power consumption for beam steering may be significantly reduced compared to conventional solutions, such as those that use a phased array. For example, if a phased-array solution had N waveguides, the worst-case power consumption to steer over all angles is $NP_\pi$, where $P_\pi$ is the required power to tune the phase by $\pi$. In embodiments of the current disclosure, the worst-case power consumption in the cross connect may be $\log 2NP_\pi$. In many embodiments, for N=1024, the current techniques may use 100 times less power consumption than the conventional techniques.

In many embodiments, an apodization in the y direction may exist automatically and may be the Fourier transform of the input waveguide mode. Using conventional techniques, the outer grating waveguides must contain less optical power in order to have an apodized launch power distribution.

In most embodiments, back reflection to a source may be significantly lower than the conventional techniques. In many embodiments of the current disclosure, a same grating may be used for transmit and receive. In further embodiments, multiple sources and receivers may use the same grating simultaneously. In certain embodiments, a transmitter may also serve as a receiver to receive reflected light. In other embodiments, a separate receiver similar to a transmitter may be used to receive reflected light. In certain embodiments, a beam steerer may scan more than a 70-degree scan range. In certain embodiments, a switch array may be a tree arrangement of Mach-Zehnder switches. In some embodiments, there may be a thermo-optic phase shifter that may be used to toggle between paths in a switch tree. In many embodiments, by changing a phase in a Mach-Zehnder interferometer in a switch in a switch tree, light may be directed to a different path in the switch tree. In certain embodiments, multiple phase shifters in the same level may be connected to lower switching complexity.

In most embodiments, there may be a free propagation space between a switching capability and an emitter of a beam steerer. In many embodiments, a beam steerer may have a free propagation region between a cross connect and a surface emitting grating. In certain embodiments, a free propagation region may be a region of space that allows light waves to freely propagate. In certain embodiments, having a free propagation space between a switching capability and an emitter may remove the need for thermal isolation. In most embodiments, having a separation between a switching capability and an emitter may remove the need to worry about thermal cross talk. In further embodiments, a beam steerer may have an M×N cross connect each of the M ports is connected to a different laser.

In most embodiments, light from a beam steerer may be reflected off a scene and detected by a photodetector. In other embodiments, light from a beam steerer may be reflected off a scene and received by the beam steerer itself. In further embodiments, light from a beam steerer may be reflected off a scene and received by another beam steerer. In certain embodiments, a receiver for the light may need to steer in a similar manner to a transmitter to receive reflected light. In some embodiments, using a same beam emitter as a receiver may remove the need for a receiver to steer as the beam emitters steers because the receiver may automatically be receiving at the correct angles to receive reflected light. In certain embodiments, an optical circulator may be placed in a device that is both a transmitter and a receiver.

Refer now to the example embodiment of FIG. 1, which illustrates a beam steerer that uses a 1-D phased array. Beam steerer 105 consists of an array of 1D surface-emitting elements, such as waveguide surface emitting gratings 110 and 115. There is a phase shifter on each grating input waveguide, such as phase shifter 120 on surface emitting grating 110 and phase shifter 125 on surface emitting grating 115. Phase shifters 128, such as phase shifter 120 and 125, control how the beam steers in the y dimension and wavelength is changed to steer in the x dimension. To steer over a reasonable angular range in the y dimension, waveguides 130 must generally be spaced less than a wavelength apart. In FIG. 1, this close spacing of waveguides 130 typically results in optical crosstalk between waveguides and difficulties in fabrication. Also, the phases are partially randomized after fabrication, so a lengthy, complicated calibration of phase shifters 128, such as phase shifter 120 and 125, is required. Also, controlling phase shifters 128 requires significant power consumption, and avoiding thermal crosstalk is difficult. Finally, the gaps between waveguides 130 reduce the overall grating efficiency.

Figure 2:
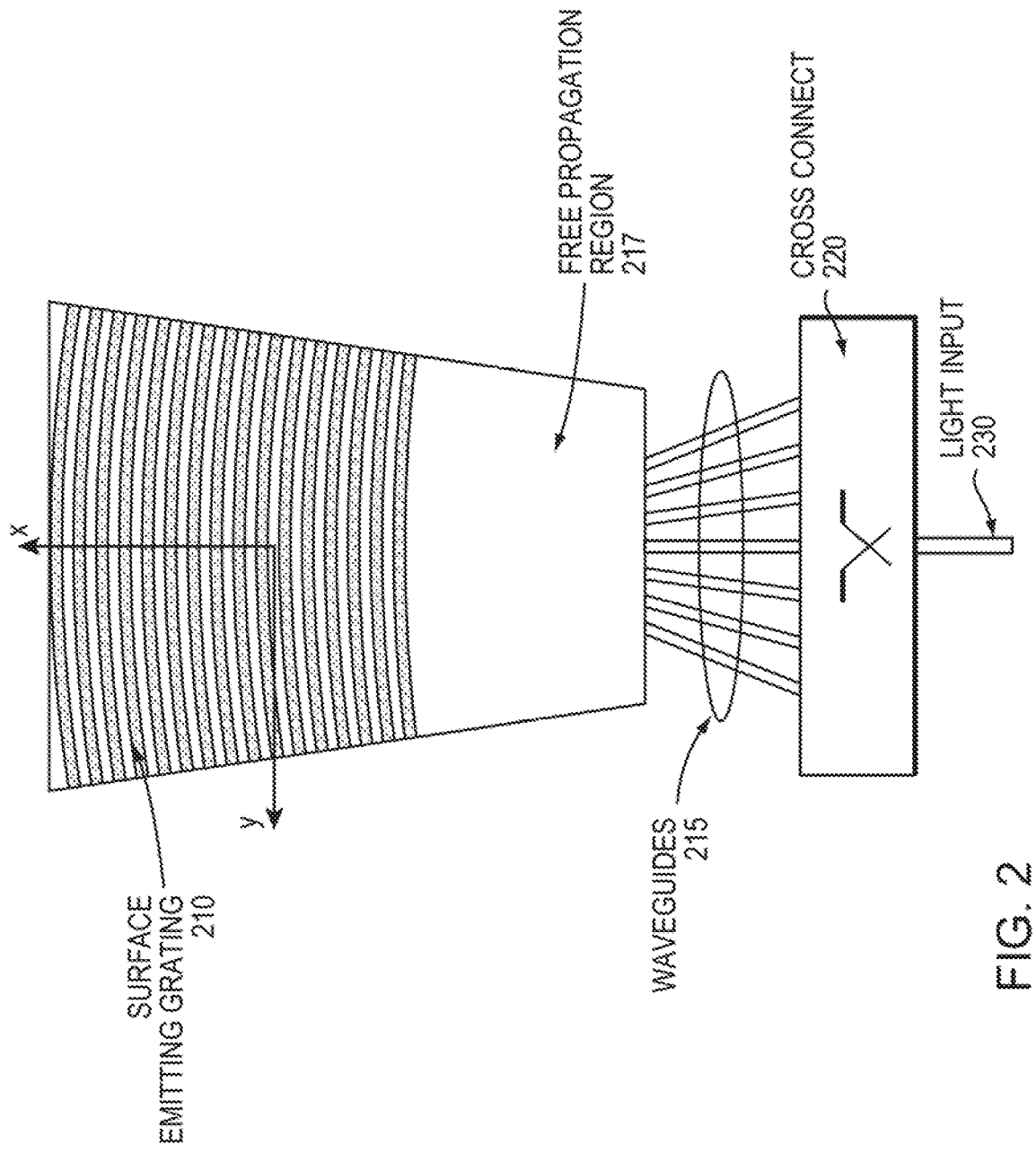
FIG. 2 is a simplified illustration of a surface-emitting grating that may be illuminated by waveguides at different angles, in accordance with an embodiment of the present disclosure.

Refer now to the example embodiment of FIG. 2, which illustrates a large surface-emitting grating, which can be illuminated by waveguides at different angles. In the embodiment of FIG. 2, beam steering in the y dimension is done by illuminating different waveguides of waveguides 215 at different angles to the grating. Optical cross connect 220 determines which waveguide of waveguides 215 is illuminated. Light exits optical cross connect 210 propagates through free propagation region, and enters surface emitting grating. To scan in the y dimension, cross connect 220 cycles through waveguides 215 by passing light through different paths of cross connect 220. In FIG. 2, beam steering in the x direction is done by tuning wavelength. The strength of surface-emitting grating 210 may get stronger as x gets larger so as to approximate a Gaussian emission shape from grating 210. Grating 210 is curved, centered approximately on input to waveguides 215. Light input 230 provides light to cross connect 220. In certain embodiments, there may be multiple light inputs and multiple cross connects, where the multiple cross connects may be optically coupled to the waveguides.

Figure 3:
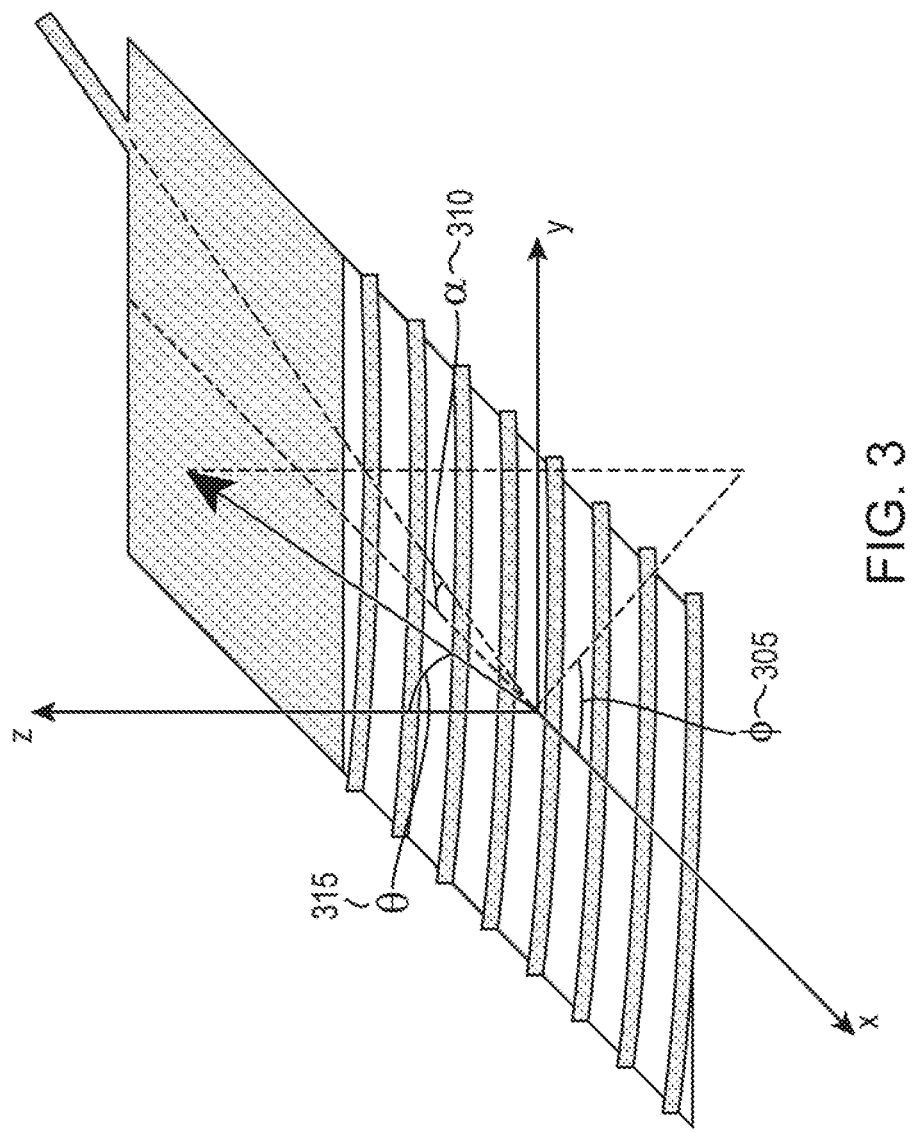
FIG. 3 is a simplified illustration showing a relationship of emitted light to a grating and input waveguide, in accordance with an embodiment of the present disclosure.

Refer now to the example embodiment of FIG. 3, which shows a relationship of light propagation angles to the grating and input waveguide. The equations relating output angle $\varphi$ 305 and $\theta$ 315 to the input angle $\alpha$ 310 and the wavelength $\lambda$ may be given by the following equations:

$$\beta \cos \alpha - k \sin \theta \cos \varphi = 2\pi/\Lambda \qquad \text{Equation 1:}$$

$$\beta \sin \alpha + k \sin \theta \sin \varphi = 0 \qquad \text{Equation 2:}$$

Where $\beta$ is the propagation constant in the grating, k is the propagation constant in the free space outside the grating, and $\Lambda$ is the grating pitch. $\beta = 2\pi n_{wg}$, and $k = 2\pi n_{fs}$, where $n_{wg}$ is the effective index in the grating waveguide, $n_{fs}$ is the index in the free space outside the grating, and $\lambda$ is the wavelength.

Refer now to the example embodiments of FIGS. 4a, 4b, and 4c, which illustrate a front, side, and top view, respectively, of sample light scans from a beam steerer. In the example embodiment of 4a, light has exited from waveguide 410 to propagate as diverging light beam 415 through free propagation region 417. Light beam 415 exits grating 420 at point 425.

Likewise, light has exited from waveguide 430 as light beam 435 and propagates through free propagation area 417. Light beam 435 exits grating 420 at point 440, which are the same point on the grating, but each light beam has a different exit angle as show in FIG. 4c. Beam 435 exits as 450 and beam 415 exits as 455. The example embodiment of FIG. 4b represents a side view of how light exits beam steerer. In the example embodiment of FIG. 4b, light 445 exits grating 420.

Figure 5:
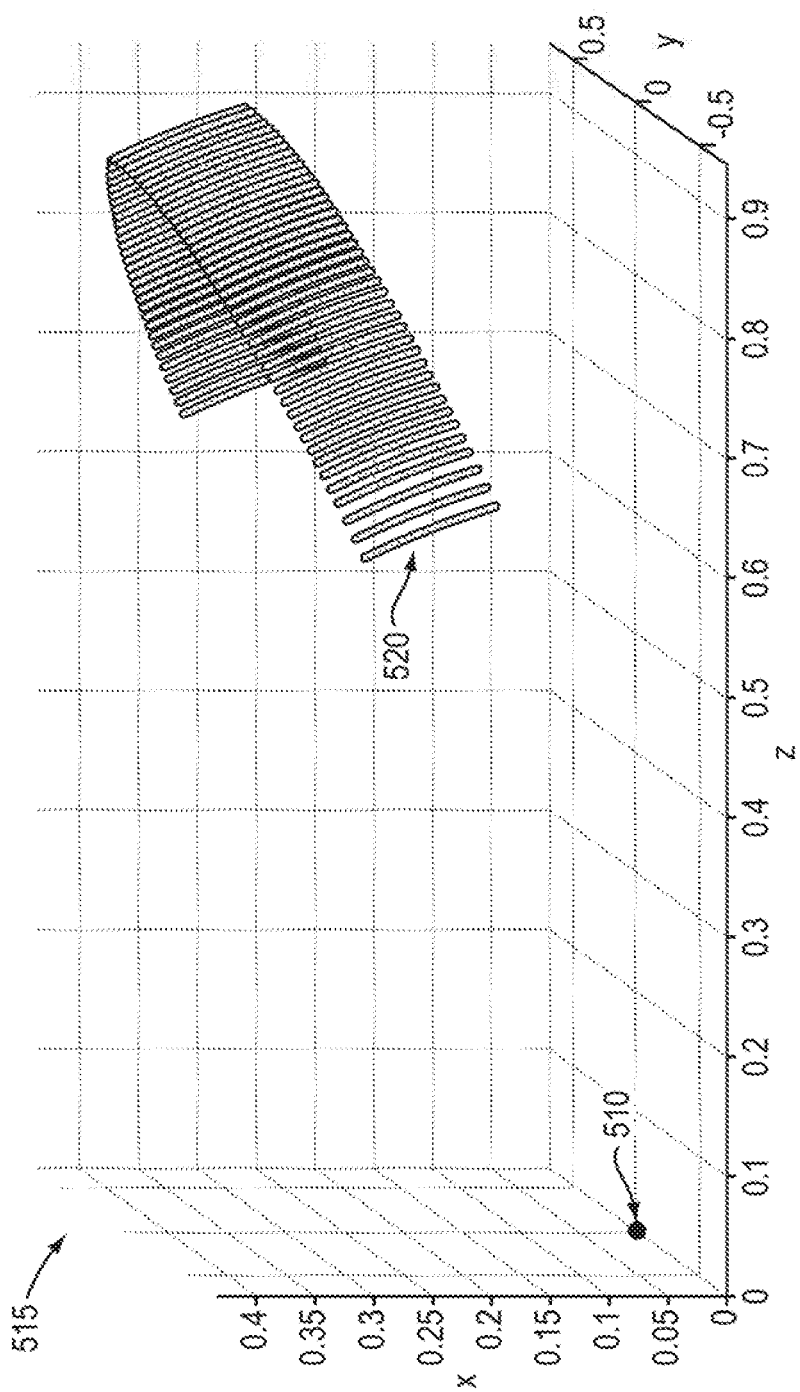
FIG. 5 is a simplified illustration of sample scanning positions, in accordance with an embodiment of the present disclosure.

Refer now to the example embodiment of FIG. 5, which illustrates a sample scan relative to the grating. Scan point 510 on three dimensional graph 515 represents where the grating is. Light scan 520 represents the light transmitted by a beam steerer. As shown, light scan 520 represents a distribution of vertical light scans. The vertical scans are done by changing wavelength, and the lateral scans are done by selecting different input waveguides 420 to the grating. Also note, in this embodiment light scan 520 is tilted upwards from scan point 510. In this embodiment, calculated scanned points for light scan C are at a distance of 1 from the grating, using the following parameters: $\Lambda=900$ nm, $n_{wg}=2.1$, $n_{fs}=1.0$, $\alpha=-20°$ to $20°$, and $\lambda=1500$ to $1600$ nm. In FIG. 5, the angular step size of alpha in the plot is 0.25 degrees.

Figure 6:
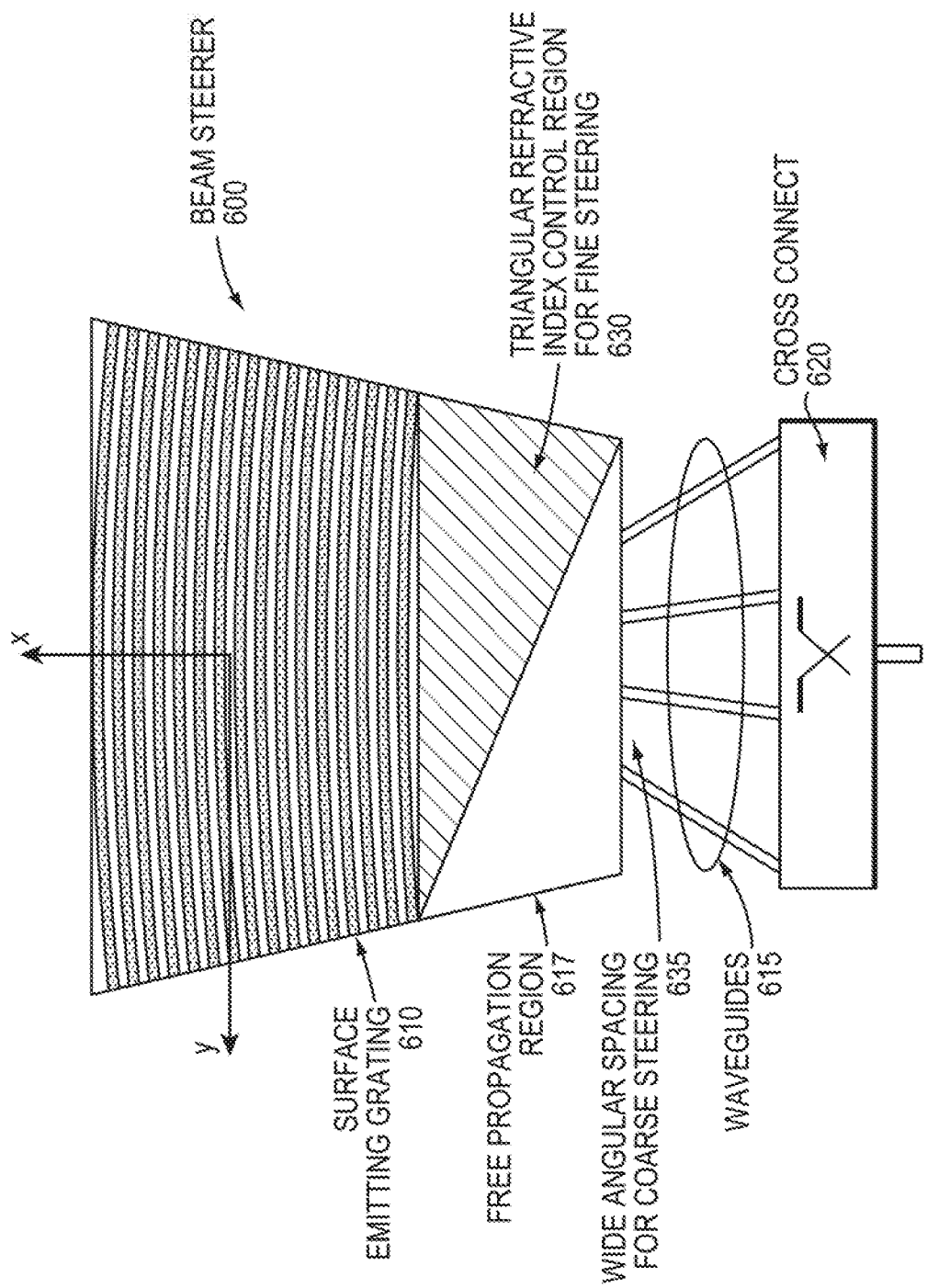
FIG. 6 is a simplified illustration of a surface-emitting grating with an adjustable refractive index, in accordance with an embodiment of the present disclosure.

Refer now to the example embodiment of FIG. 6, which illustrates a beam steerer with fine and coarse control of the beam steer. In the example embodiment of FIG. 6, there is a triangular region 630 with an adjustable refractive index in the free-space propagation region 617 between grating 610 and input waveguides 615 which may used to change the beam angle a small amount to perform fine steering. In the example embodiment of FIG. 6, waveguides 615 have a relatively large relative angular spacing between them 635, which provides coarse steering in the y direction.

Figure 7:
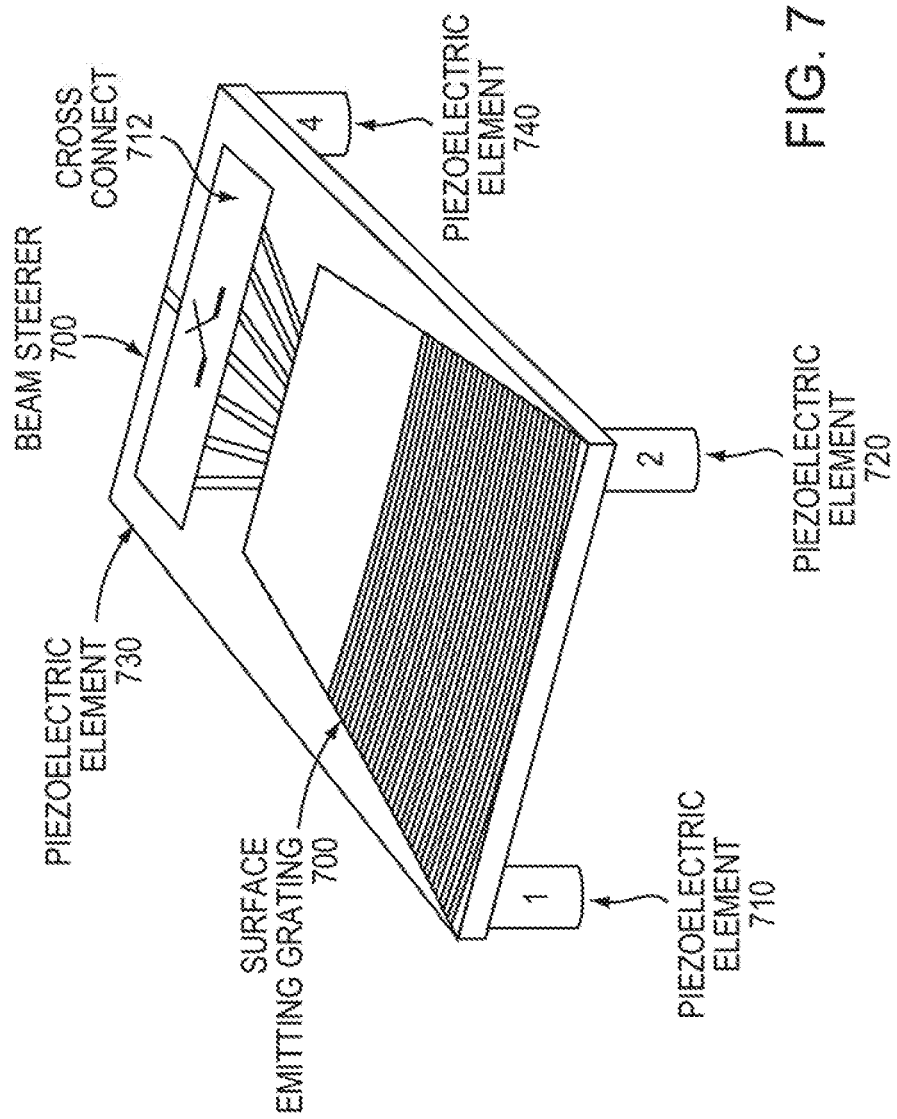
FIG. 7 is a simplified illustration of a surface-emitting grating mounted on piezoelectric (PZT) elements, in accordance with an embodiment of the present disclosure.

Refer now to the example embodiment of FIG. 7, which illustrates a surface emitting grating with a cross connect mounted to piezoelectric elements. In the example embodiment of FIG. 7, surface grating has piezoelectric element 710 in a first corner, piezoelectric element 720 is a second corner, piezoelectric element 730 in a third corner (note this element is hidden due to the angle of surface emitting grating 700), and piezoelectric element 740 in a forth corner. By using pairing piezoelectric elements 710-740 and using them in a push pull manner, surface emitting grating 700 may be moved on the x axis. In this embodiment, when surface emitting grating emits light, shifting around the x axis enables fine steering of a scan.

Figure 8:
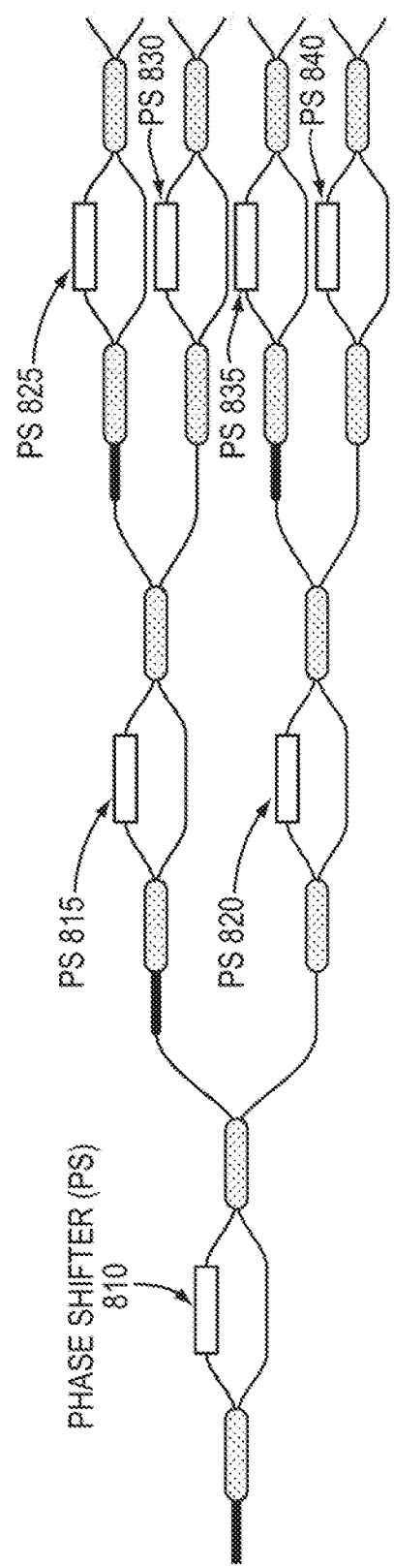
FIG. 8 is a simplified illustration of an optical cross connect, in accordance with an embodiment of the present disclosure.

Refer now to the example embodiment of FIG. 8, which illustrates a 1×8 cross connect. In FIG. 8, the cross connect has a tree structure of 1×2 Mach-Zehnder switches. In this embodiment, cross connect 800 generally does not require calibration because optically interfering arms are in small Mach-Zehnder interferometers. In this example embodiment, there are phase shifters (PS) 810, 815, 820, 825, 830, 835, and 840. In this example embodiment, PS 815 and 820 are powered together. In this example embodiment, PS 825, 830, 835, and 840 are powered together. In this example embodiment, switching between 8 paths occurs using only 3 switches, one for PS 810, one for PS 815 and 820, and one for PS 825, 830, 835, and 840.

Figure 9:
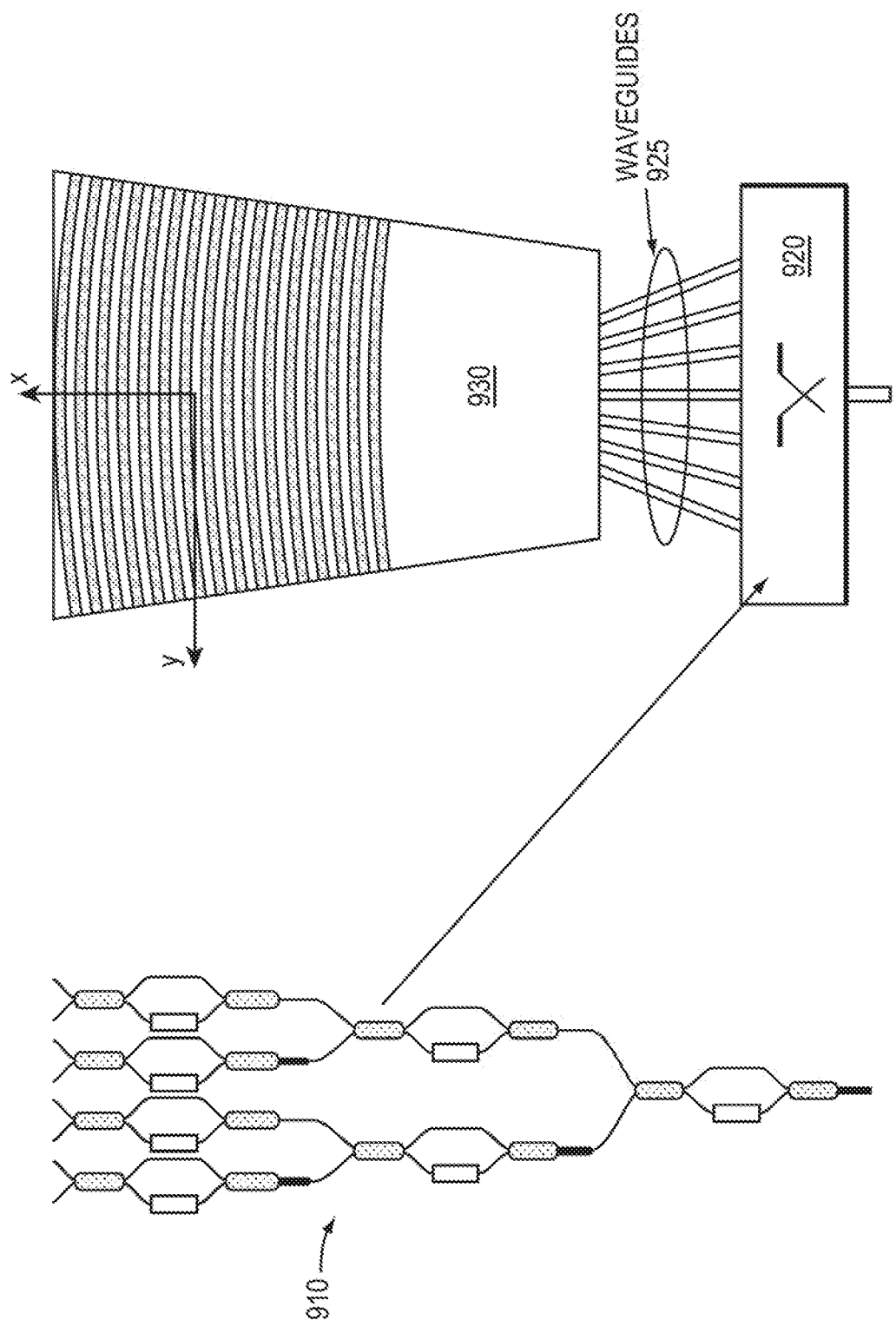
FIG. 9 is an illustration of an optical cross connect and beam steerer, in accordance with an embodiment of the present disclosure.

Refer now to the embodiment of FIG. 9, which illustrates a particular cross connect. In the example embodiment of FIG. 9, cross connect 920 in beam steerer 930 may be cross connect 910 or may be several cross connects similar to that of cross connect 910 to make cross connect 920. In certain embodiments, where there are multiple cross connects, such as cross connect 910, that make up a cross connect for a beam steerer, then each cross connect may be powered individually. Referring back to the example embodiment of FIG. 9, Cross connect 910 may be used to cycle through waveguides 925. Referring back to FIG. 8, phase shifters 810, 815, 825, 830, 835, and 840 may be selectively activated and deactivated to connect light passing through cross connect 800 to reach different end points of cross connect 800, which may be connected to waveguides.

Figure 10:
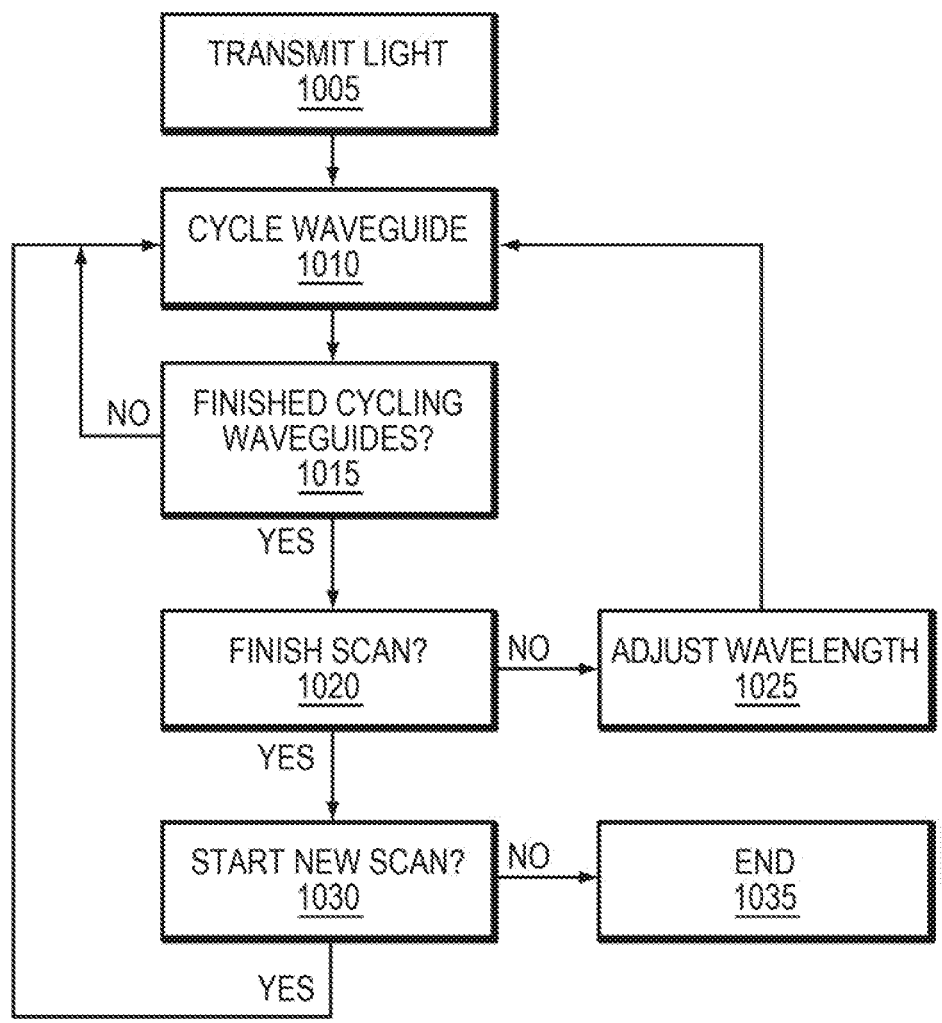
FIG. 10 is a simplified method for creating an optical scan, in accordance with an embodiment of the present disclosure.

Refer now to the example embodiments of FIGS. 9 and 10. Light is transmitted into cross connect 920 (step 1005). Beam steerer 930 cycles waveguide by changing which waveguide receives light by adjusting cross connect 920 to steer light in the Y direction (step 1010). A determination is made if the waveguides have finished cycling (step 1015). If the waveguides have not finished cycling then the waveguide is cycled (step 1010). If the waveguide is finished cycling, then a determination is made if the scan is finished (step 1020). If the scan is not finished, the wavelength is adjusted step (1025) and the process goes to step 1010. If a scan is finished, a determination is made whether to start a new scan (step 1030). If a new scan is to be started, the process goes to step 1010. If a new scan is not to be performed, the process is ended (step 1035).

Figure 11:
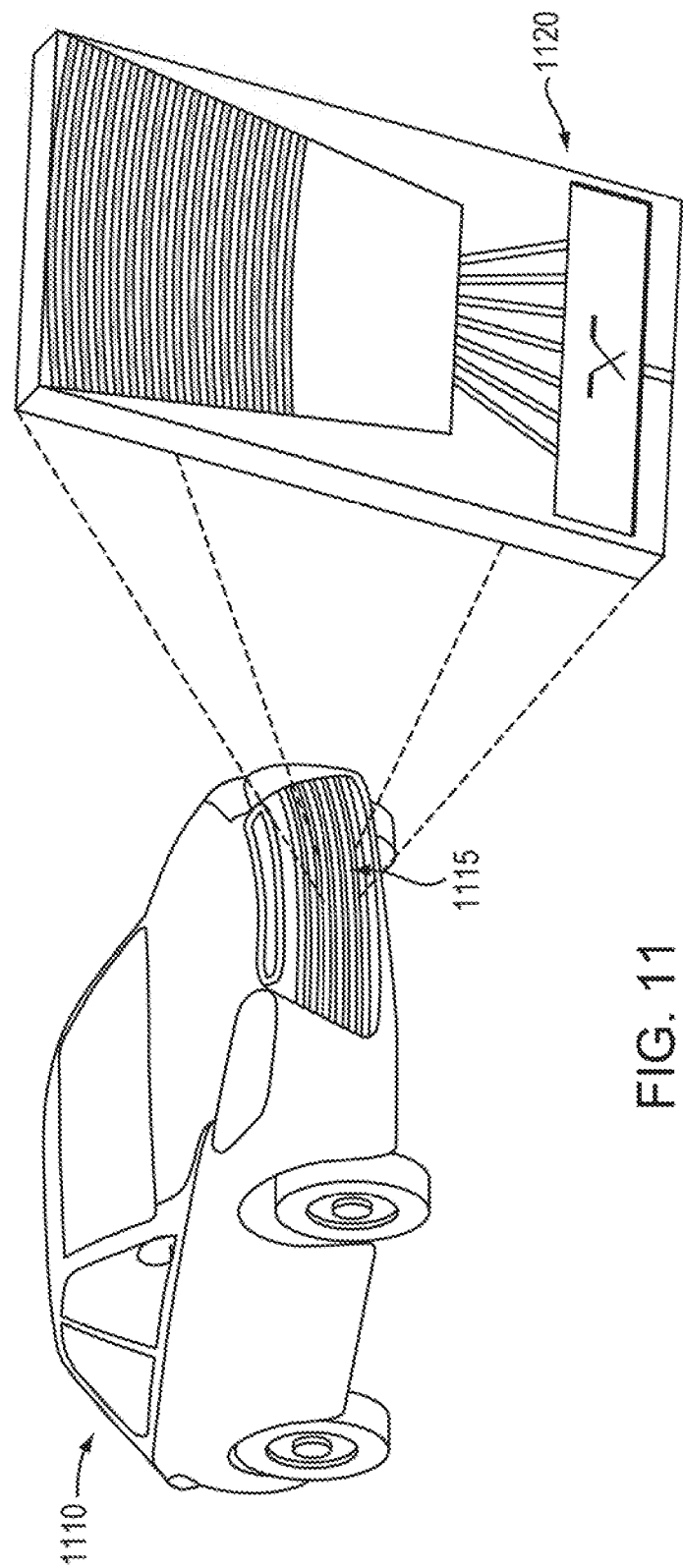
FIG. 11 is a simplified embodiment of a beam steer mounted at a downward facing angle on a car, in accordance with an embodiment of the present disclosure.

Refer now to the example embodiment of FIG. 11, which illustrates a beam steerer in a car. Car 1110 has a grill 1115. Installed in a manner open to light wave propagation is beam steerer 1120. Beam steerer 1120 is placed at a tilted pitch. Refer now as well to FIG. 5. Placing beam steerer 1120 at a tilted pitch will cause a scan, such as scan 520 of FIG. 5, to be directly in front of car 1110 instead of pointing upward as scan 520 of FIG. 5.

Figure 12:
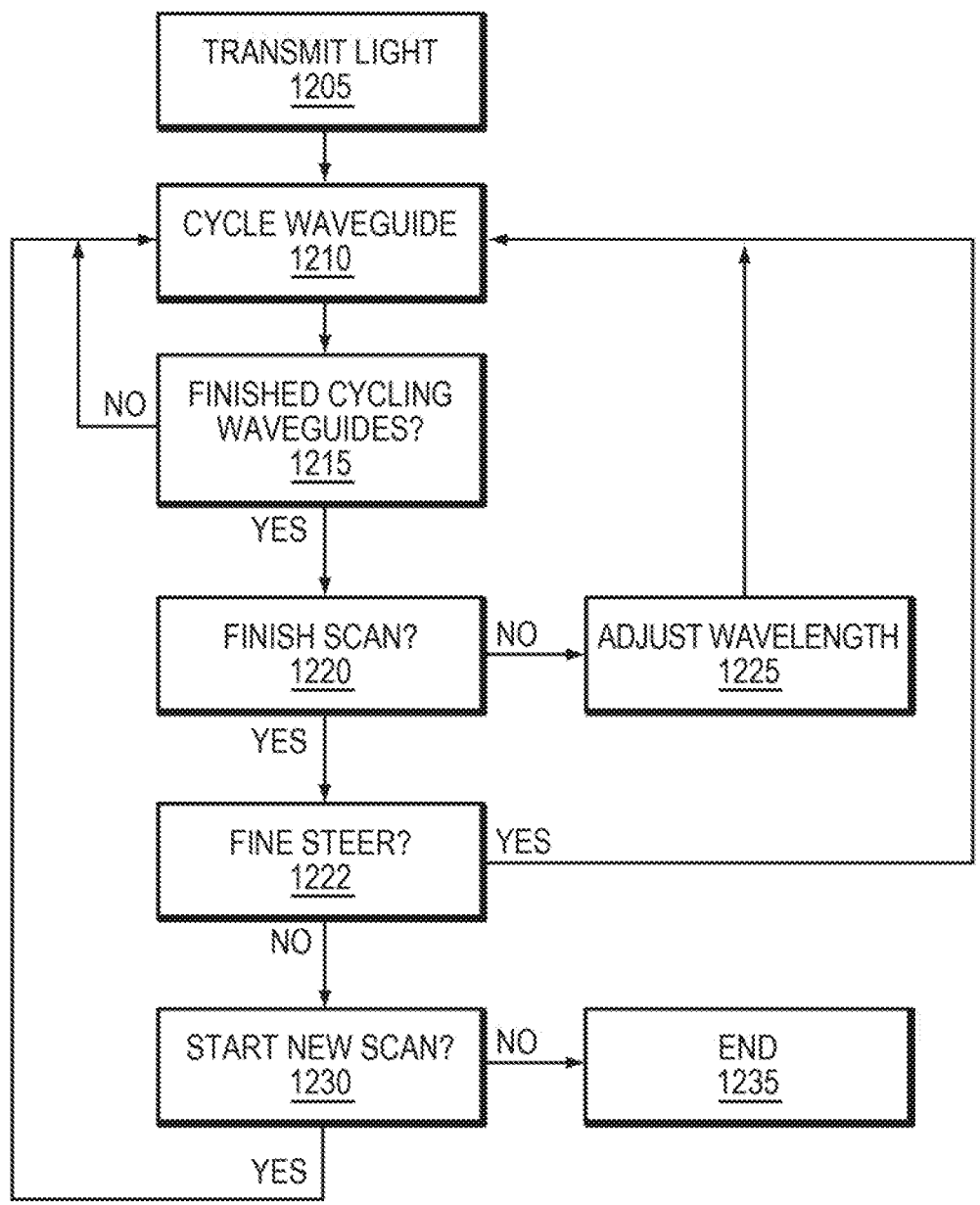
FIG. 12 is a simplified method for creating an optical scan with fine steering, in accordance with an embodiment of the present disclosure.

Refer now to the example embodiments of FIGS. 6 and 12. Light is transmitted into cross connect 620 (step 1205). Beam steerer 600 cycles waveguide by changing which waveguide receives light by adjusting cross connect 620 to steer light in the Y direction (step 1210). A determination is made if the waveguides have finished cycling (step 1215). If the waveguides have not finished cycling then the waveguide is cycled (step 1210). If the waveguide is finished cycling, then a determination is made if the scan is finished (step 1220). If the scan is not finished, the wavelength is adjusted step (1225) and the process goes to step 1210. If a scan is finished, a determination, a determination is made to perform fine steering (step 1222). If fine steering is performed, refractive index 630 of beam steerer 600 may be changed to effectuate the fine steering and the process proceeds to step 1210. Referring now to FIG. 7, in alternative embodiments, PZT elements 710, 720, 730, and 740 may be moved to effectuate fine steering. Referring back to FIGS. 6 and 12, if a decision is made not to fine steer, then a decision is made whether to start a new scan (step 1230). If a new scan is to be started, the process goes to step 1210. If a new scan is not to be performed, the process is ended (step 1235).

Figure 13:
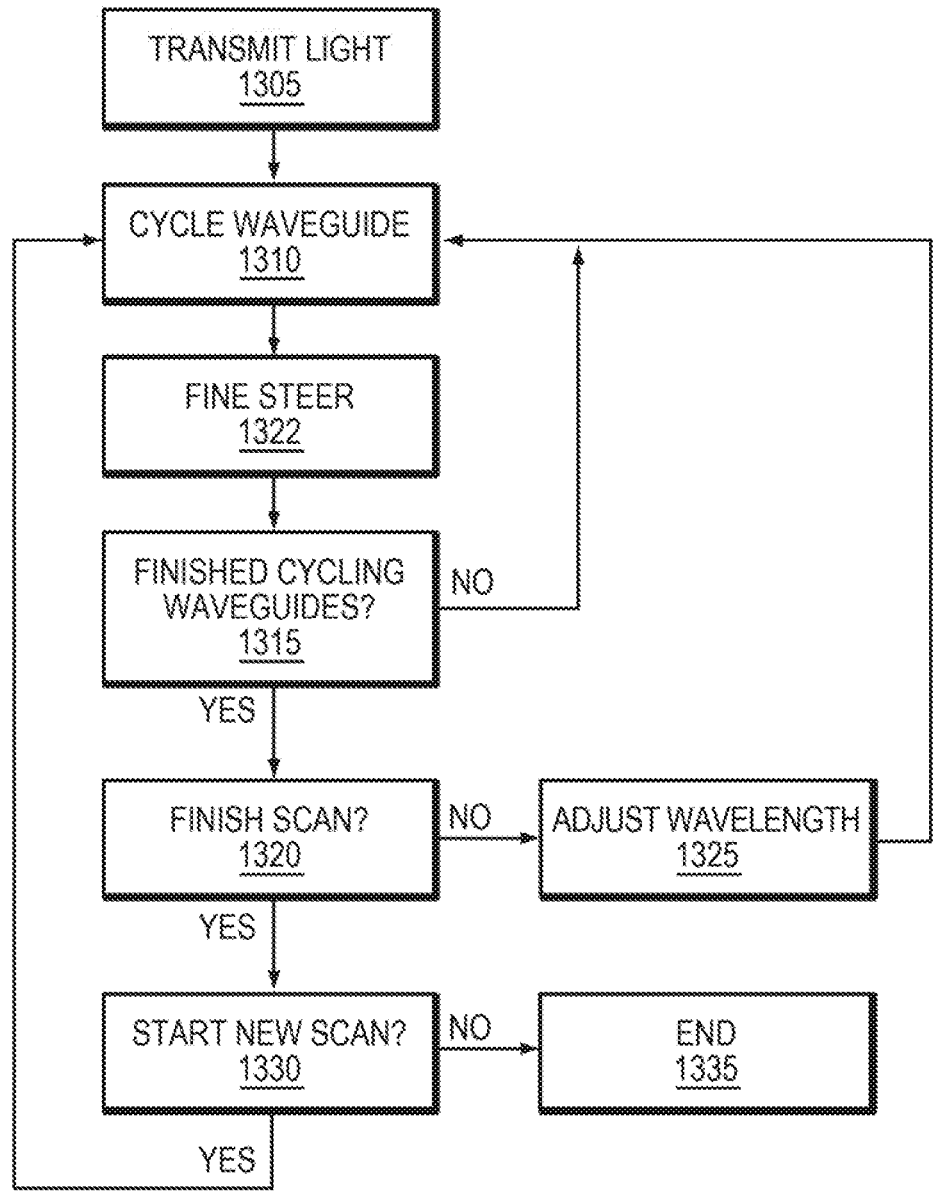
FIG. 13 is an alternative simplified method for creating an optical scan with fine steering, in accordance with an embodiment of the present disclosure.

Refer now to the example embodiments of FIGS. 7 and 13. Light is transmitted into cross connect 712 (step 1305). Beam steerer 700 cycles waveguide by changing which waveguide receives light by adjusting cross connect 712 to steer light in the Y direction (step 1310). Fine steering is performed by using PZT elements 710, 720, 730, and 740 in a push pull manner to move beam steerer 700 around the X axis (step 1322). Referring to FIG. 6, in alternative embodiments, refractive index 630 of beam steerer 600 may be changed to effectuate the fine steering.

Referring back to FIGS. 7 and 13, a determination is made if the waveguides have finished cycling (step 1315). If the waveguides have not finished cycling then the waveguide is cycled (step 1310). If the waveguide is finished cycling, then a determination is made if the scan is finished (step 1320). If the scan is not finished, the wavelength is adjusted step (1325) and the process goes to step 1310. A decision is made whether to start a new scan (step 1330). If a new scan is to be started, the process goes to step 1310. If a new scan is not to be performed, the process is ended (step 1335).

In most embodiments, collection efficiency may be irrelevant as the light transmitted is outside of a range that can impact human vision. In some embodiments, the wavelength of the light may be in the range of 1550 nm. In many embodiments, one or more of the current techniques may be performed on a Digital Signal Processing (DSP) of a receiver. In most embodiments, the output of a scanning system may be sent to a DSP. In certain embodiments, a DSP may process the captured light to determine a point cloud. In many embodiments, a DSP may be a custom designed ASIC chip in order to process measured light quickly and power efficiently. In most embodiments, a DSP may be able to determine change in the wavelength of reflected light. In many embodiments, a DSP may be able to detect change of phase of reflected light. In certain embodiments, a DSP may be able to detect other changes in the reflected light. In almost all embodiments, a DSP may be able to determine distance by looking at changes in reflected light. In many embodiments, a DSP may be able to determine location within three dimensions by looking at reflected light.

In some embodiments, one or more of the techniques described herein may be stored on a computer readable medium. In certain embodiments, a computer readable medium may be one or more memories, one or more hard drives, one or more flash drives, one or more compact disk drives, or any other type of computer readable medium. In certain embodiments, one or more of the embodiments described herein may be embodied in a computer program product that may enable a processor to execute the embodiments. In many embodiments, one or more of the embodiments described herein may be executed on at least a portion of a processor.

In most embodiments, a processor may be a physical or virtual processor. In other embodiments, a virtual processor may be spread across one or more portions of one or more physical processors. In certain embodiments, one or more of the techniques or embodiments described herein may be embodied in hardware such as a Digital Signal Processor DSP. In certain embodiments, one or more of the embodiments herein may be executed on a DSP. One or more of the techniques herein may be programed into a DSP. One or more of the techniques herein may be fabricated in a DSP. In some embodiments, a DSP may have one or more processors and one or more memories. In certain embodiments, a DSP may have one or more computer readable storages. In other embodiments, one or more of the embodiments stored on a computer readable medium may be loaded into a processor and executed.

Having thus described several aspects and embodiments of the technology of this application, it is to be appreciated that various alterations, modifications, and improvements will readily occur to those of ordinary skill in the art. Such alterations, modifications, and improvements are intended to be within the spirit and scope of the technology described in the application. It is, therefore, to be understood that the foregoing embodiments are presented by way of example only and that, within the scope of the appended claims and equivalents thereto, inventive embodiments may be practiced otherwise than as specifically described. In addition, any combination of two or more features, systems, articles, materials, and/or methods described herein, if such features, systems, articles, materials, and/or methods are not mutually inconsistent, is included within the scope of the present disclosure. In many embodiments herein, optically coupled may mean that the coupled elements are capable of transmitting or transferring light between the elements.

Also, as described, some aspects may be embodied as one or more methods. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

The phrase "and/or," as used herein in the specification and in the claims, should be understood to mean "either or both" of the elements so conjoined, i.e., elements that are conjunctively present in some cases and disjunctively present in other cases.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified.

The terms "approximately" and "about" may be used to mean within +20% of a target value in some embodiments, within +10% of a target value in some embodiments, within +5% of a target value in some embodiments, and yet within +2% of a target value in some embodiments. The terms "approximately" and "about" may include the target value.

In the claims, as well as in the specification above, all transitional phrases such as "comprising," "including," "carrying," "having," "containing," "involving," "holding," "composed of," and the like are to be understood to be open-ended, i.e., to mean including but not limited to. The transitional phrases "consisting of" and "consisting essentially of" shall be closed or semi-closed transitional phrases, respectively.

The terms "approximately" and "about" may be used to mean within ±20% of a target value in some embodiments, within ±10% of a target value in some embodiments, within ±5% of a target value in some embodiments, or within ±2% of a target value in some embodiments. The terms "approximately" and "about" may include the target value.

What is claimed is:

1. An optical apparatus comprising:
   a surface emitting grating;
   a free-propagation region optically coupled to the surface emitting grating; and
   waveguides optically coupled to the free-propagation region; wherein each of the waveguides is disposed at different angles to each other waveguide; wherein each waveguide of the waveguides is disposed at a different angle to and within a same plane as the surface emitting grating; wherein the surface emitting grating is curved; wherein the proximate center of the curvature of the grating is proximate to the inputs to the waveguides; and wherein the surface emitting grating is enabled to be illuminated through the free-propagation region by using a cross connect to selectively cycling through illumination of each waveguide of the waveguides; wherein when light when light is launched through each respective waveguide connected to free propagation region, the light from each respective waveguide travels to exit the surface emitting grating at a different angle.

2. The apparatus of claim 1 wherein grating strength becomes stronger as distance from the waveguides increases.

3. The apparatus of claim 2 further comprising a cross connect; the cross connect optically coupled to the waveguides.

4. The apparatus of claim 3 further comprising a laser connected to the cross connect.

5. The apparatus of claim 4 wherein the illumination is caused by a laser; wherein the wavelength of the laser is tunable.

6. The apparatus of claim 4 further comprising lasers connected to the cross connect.

7. The apparatus of claim 4 wherein the cross connect is enabled to cycle through the waveguides.

8. The apparatus of claim 7 wherein the cross connect is a M×N cross connect; wherein M represents the number of light sources or receivers to be connected to the grating; wherein N represents the number of scan angles in the y direction.

9. The apparatus of claim 4 wherein the cross connect has a tree structure of Mach-Zehnder switches.

10. The apparatus of claim 1 wherein the center of curvature of the grating is proximate to a connection point of one of the waveguides to the free-propagation region.

11. The apparatus of claim 3 wherein the wavelength scan angles are tilted forward from the grating.

12. The apparatus of claim 3 further comprising a laser connected to the cross connect.

13. The apparatus of claim 10 further comprising piezoelectric elements (PZT); wherein the PZTs are arranged incident to the surface emitting grating enabling to tilt the surface emitting grating.

14. The apparatus of claim 12 further comprising a beam steerer enabled to cycling through the cross connect to illuminate each waveguide of waveguides and to tune a wavelength of light used to illuminate the waveguides.

15. The apparatus of claim 10 wherein there is a triangular phase shifting region.

16. The apparatus of claim 1 wherein each of the waveguides is optically connected to an optical switch.

17. The apparatus of claim 1 wherein each of the waveguides is optically connected to a light source through an optical switch.

* * * * *